(12) United States Patent
Schafferer

(10) Patent No.: US 6,774,823 B1
(45) Date of Patent: Aug. 10, 2004

(54) CLOCK SYNCHRONIZATION LOGIC

(75) Inventor: Bernd Schafferer, Gloucester, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/349,204

(22) Filed: Jan. 22, 2003

(51) Int. Cl.[7] .............................................. H03M 7/00
(52) U.S. Cl. .......................................... 341/61; 341/50
(58) Field of Search ...................... 341/50, 61; 360/31; 331/1 A; 704/219

(56) References Cited

U.S. PATENT DOCUMENTS 5,087,992 A * 2/1992 Dahandeh et al. ............ 360/31
5,115,208 A * 5/1992 Masdea et al. ............. 331/1 A
6,169,970 B1 * 1/2001 Kleijn ......................... 704/219

* cited by examiner

*Primary Examiner*—Jean Bruner Jeanglaude
(74) *Attorney, Agent, or Firm*—Wolf, Greenfield & Sacks, P.C.

(57) ABSTRACT

A method and apparatus for synchronizing actions of two circuits or two parts of one circuit where each circuit utilizes a different clock signal. More than one clock signal are derived from a master clock signal and run at the same frequency but have an unknown or variable phase difference. The invention solves the problem of coupling two clocked circuits where synchronization is required to properly read or sample a signal from a data line connecting the two circuits. An error window is defined during which sampling is suppressed, for example to avoid sampling during data transitions. The method of apparatus involves time shifting a pseudo-signal to generate two time-shifted signals and then defining the error window as the time during which the two time-shifted signals differ from one another.

42 Claims, 8 Drawing Sheets

CLOCK SYNCHRONIZATION LOGIC

TECHNICAL FIELD

The present invention relates to circuits utilizing clock signals. More specifically, the invention relates to synchronization of sampling operations in systems having more than one clock signal.

BACKGROUND

Many electronic circuits, including most complex digital systems, utilize signals called clocks. A clock is generally a signal which oscillates between two values at a regular rate, and which can be employed to control the timing of various events in a circuit. Events may be triggered by transitions in clock signals.

Examples of events and operations which typically rely on clock signals for successful execution include loading or writing data from data registers onto data lines, and sampling or reading data from data lines into registers. Loading or sampling several data bits, representing a data word, may be done by using a separate data line for each bit. Thus a plurality of data lines, referred to as a data bus, is used to carry the word from the writing to the sampling registers.

Frequently, one operation must wait until the completion of another operation or must wait until a certain state is achieved before execution. This may be the case if a multi-bit data bus is used to load or sample a word consisting of a plurality of data bits into a register that will simultaneously hold the bits of the word after it is sampled. In order for the bits of the word to be read correctly, and to avoid sampling bits accidentally remaining from previous words, synchronizing of write and read operations is required to ensure that all bits are sampled into the sampling register at the correct time.

One aspect complicating the design and operation of data transfer circuits occurs when two interacting circuits use two separate clock signals or two clock signals which are derived from a common clock signal source sometimes referred to as a "master clock." Even if the two clock signals operate at the same frequency, it is possible for phase shifts and phase errors to occur between the two clock signals. This can cause problems to develop in systems that rely on communication or data exchange between two circuits, each having its own clock. The same is true for two parts of one circuit, each part having its own clock. If the two circuits or the two parts of the same circuit utilizing the two clock signals are coupled to one another, timing difficulties and synchronization difficulties can arise.

As an example, if a first circuit writes data onto a bus according to a first clock signal, and a second circuit samples the data from the bus according to a second clock signal, the sampling circuit must sample the bus only when the bits on the bus are in a stable state. That is, the second circuit should avoid sampling the data on the bus during transition periods during which the data signals are changing and which can lead to errors.

Similarly, errors can arise if two parts of a single circuit are exchanging data on a data bus. The discussion herein generally treats the case of two separate circuits as similar to the case of one circuit having two or more constituent parts, or sub-circuits. Also, the discussion is applicable to more than two circuits or more than two sub-circuits.

In some systems, two circuits are interfaced or coupled, with each being clocked individually or deriving a clock signal from a common master clock signal. The master clock signal operates at some frequency, which determines the frequencies of the two derived clocks for the two circuits. However, due to one or more factors, the two clocks for the individual circuits may experience a phase shift with respect to one another. For example, temperature or supply voltage variations in one or both circuits may cause variations in propagation delays through the components of one or both circuits. For example, the data to clock delay of the registers loading data to the bus and the setup and hold times of the registers reading data from the bus depend on the operating voltage and temperature.

The problems described above become even more acute in high-speed circuits. It is known that a signal line requires a finite time to achieve a transition. For example, the time required to transition between one state and another state in a binary system is finite and measurable. Currently, such transitions can be on the order of several 100 picoseconds. The cycle time in some circuits is approximately 1000 picoseconds. Such circuits, operating in the 1+ GHz frequency range, are in common use today, and new circuits will be even faster in the future.

In order for current and future systems, such as systems loading and sampling data onto and off of data bus lines, to operate without undue error, it is sometimes useful to be able to determine the relative phase shifts between two clocks in two different coupled circuits or in two parts of the same circuit and adjust the clocks of the two circuits.

SUMMARY

Various embodiments of the present invention are described in more detail below.

Accordingly, one embodiment is directed to a method for transferring data between a first circuit, having a first clock signal, and a second circuit, having a second clock signal, comprising generating a first time-shifted signal corresponding to the first clock signal; generating a second time-shifted signal corresponding to the first clock signal; comparing the first and second time-shifted signals to yield an error signal; and sampling the data during a temporal window defined by the error signal.

Another embodiment is directed to a method for timing a circuit event, comprising time-shifting a first reference signal, by a setup time, to yield a first time-shifted signal; time-shifting any of the first reference signal or a second reference signal, by a hold time, to yield a second time-shifted signal; determining an error window defined by a temporal offset between the first and the second time-shifted signals; and performing the circuit event at a time not falling within the error window.

Yet another embodiment is directed to a system for transferring data, comprising a data line, receiving data from a first circuit, said first circuit having a first clock signal; a signal generator receiving the first clock signal and producing a pseudo-signal; a first time shifter receiving the pseudo-signal and generating a first time-shifted signal; a second time shifter receiving the pseudo-signal; and generating a second time-shifted signal; and a comparator, for comparing the first and second time-shifted signals, receiving the first and second time-shifted signals and producing an error signal for synchronizing data sampling from the data line during a temporal window defined by the error signal.

BRIEF DESCRIPTION OF THE DRAWINGS

The invention can be more fully understood from consideration of the following detailed description of illustrative embodiments thereof, and from consideration of the accompanying drawings in which.

DETAILED DESCRIPTION

As discussed briefly above, it is often useful in high speed circuits, where more that one clock signal is used, to be able to discern the relative phases of more than one clock signal. It is also sometimes desirable to be able to avoid errors, such as those potentially occurring when sampling a data line, by properly synchronizing operations affecting the data line. Accordingly, some aspects of the present invention address this problem and others, and provide in some embodiments for an "error window," defining an interval during which a sampling operation could lead to errors. In some instances, sampling or writing to a data line should not be performed to avoid the error window and to avoid data transition periods which lead to errors. Proper operation of such circuits is made possible, or facilitated by judicious synchronization of the clock signals or the circuit elements controlled by said clock signals.

Figure 1:
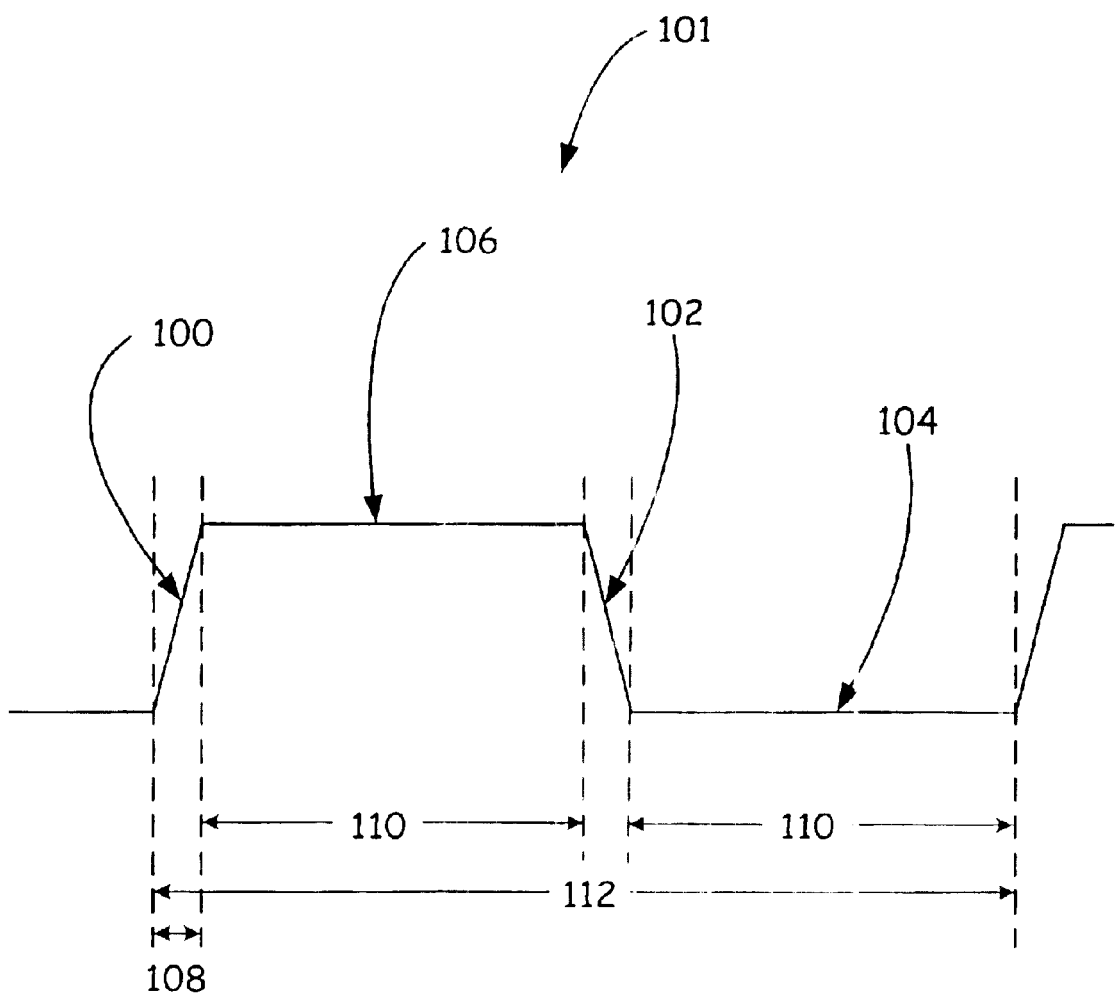
FIG. 1 illustrates an exemplary signal and state transitions as a function of time, illustrating cycle time and rise/fall times.

FIG. 1 shows an example of a signal 101 nominally having two states, a high state 106 and a low state 104. The signal may alternate between its high state 106 and its low state 104 at regular intervals, such as in a typical clock signal. The alternation may also be at irregular intervals, such as dictated by a program or a code. Rising transitions and falling transitions constitute what are known as "edges." A rising transition is referred to as a "rising edge" 100, and a falling transition is referred to as a "falling edge" 102. The figure shows a transition from a low state 104 to a high state 106 taking place during a rising edge 100. Similarly, a transition from a high state 106 to a low state 104 is shown taking place during a falling edge 102. These transitions or edges are often used as trigger points which cause circuit elements to perform certain actions. Circuit elements may be clocked or gated or synchronized with one another based on sensitivity to rising or falling edges. In moving between its high and low states, signal 101 experiences transitions which require a finite amount of time 108 to take place. The transition time 108 is the time required to conduct a rising edge 100 or falling edge 102 transition. While rising and falling edge transitions may require different transition times, it can generally be assumed that they are of roughly equal or similar duration 108.

The time periods 110 during which the signal is maintained at its high 106 or low 104 states are typically longer than the time 108 required to transition between the states. As circuits operate at higher speeds, the finite transition time 108 can become noticeable with respect to the signal's stable time 110, during which the signal occupies one of the high or low states, and also becomes noticeable with respect to the total cycle time 112. This is so because the transition time 108 is usually a result of a physical limitation in the electronic device and has a minimum duration dictated by the device's design. Circuit speed is increased by decreasing the time 100, but time 108 cannot generally be decreased accordingly. Hence the ratio of times 108 to 100 (or 108 to cycle time 112) becomes larger as the cycle time 112 is decreased.

It is preferable to avoid sampling a signal during a rise or fall transition, 100, 102, as sampling a signal during these intervals can lead to errors in the sampled signal. For example, if a signal is sampled on or near one of its edges, it is possible that the sampling circuit will be unable to determine whether the value sampled was a high 106 or low 104 value. For this reason, it can sometimes be important to determine when a signal is in a stable high 106 or low 104 state, and when it is in a rising 100 or falling 102 transition.

Figure 2:
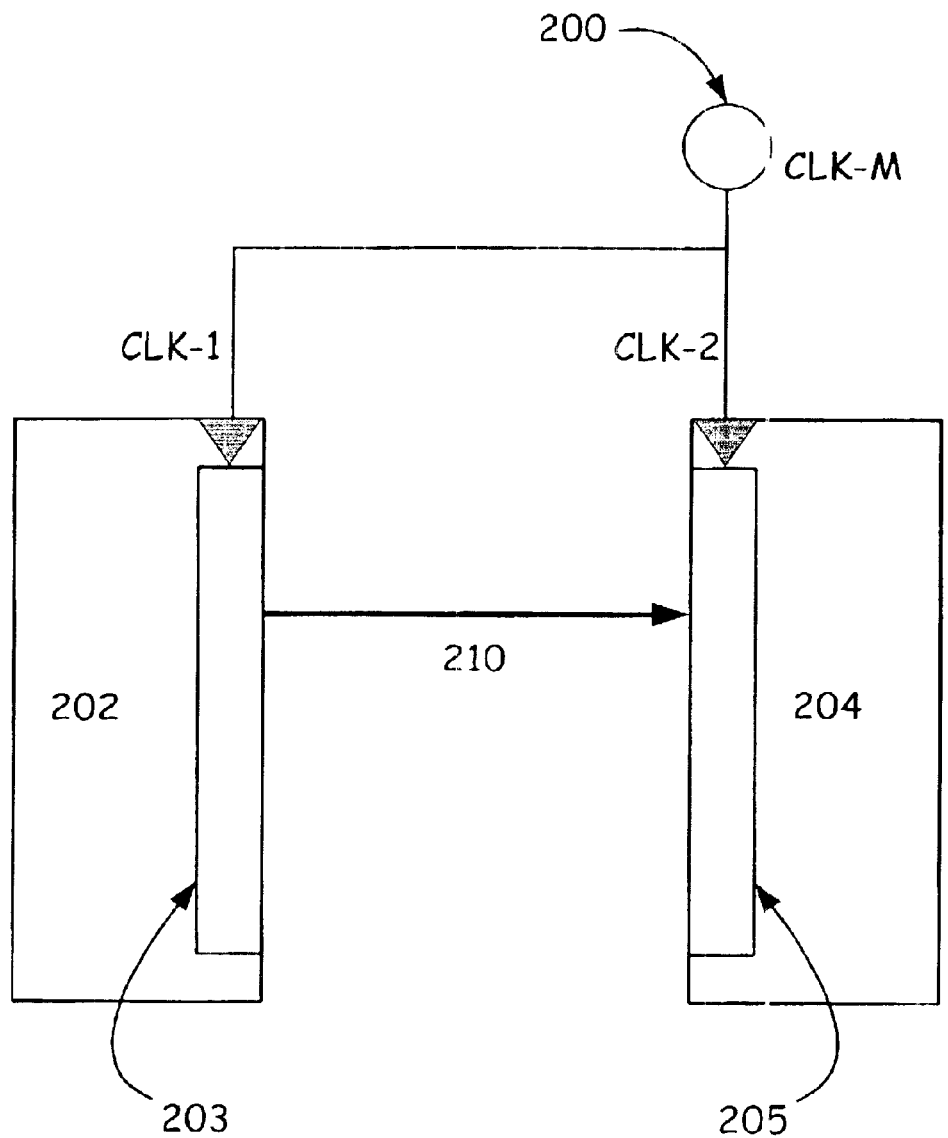
FIG. 2 illustrates an exemplary system of two circuits, having two clocks, the circuits coupled by a data bus and driven by a master clock.

An example of two circuits exchanging data signals is illustrated in FIG. 2, in which a first circuit 202 and a second circuit 204 are coupled by a data bus 210. The first and second circuits receive clock signals CLK-1 and CLK-2, respectively, from a master clock 200 designated as CLK-M.

Circuits 202 and 204 comprise first and second registers 203 and 205, respectively, which can hold and store data. The first register 203, is coupled to the first circuit 202, and data is loaded from first register 203 onto bus 210 upon some condition or transition of clock signal CLK-1. The second register 205 samples data from the bus 210 on some condition or transition of clock signal CLK-2. Thus, some coordination involving registers 203 and 205 or their associated clock signals CLK-1 and CLK-2 is required for proper sampling of the data from one circuit 202 to the next 204.

Figure 3:
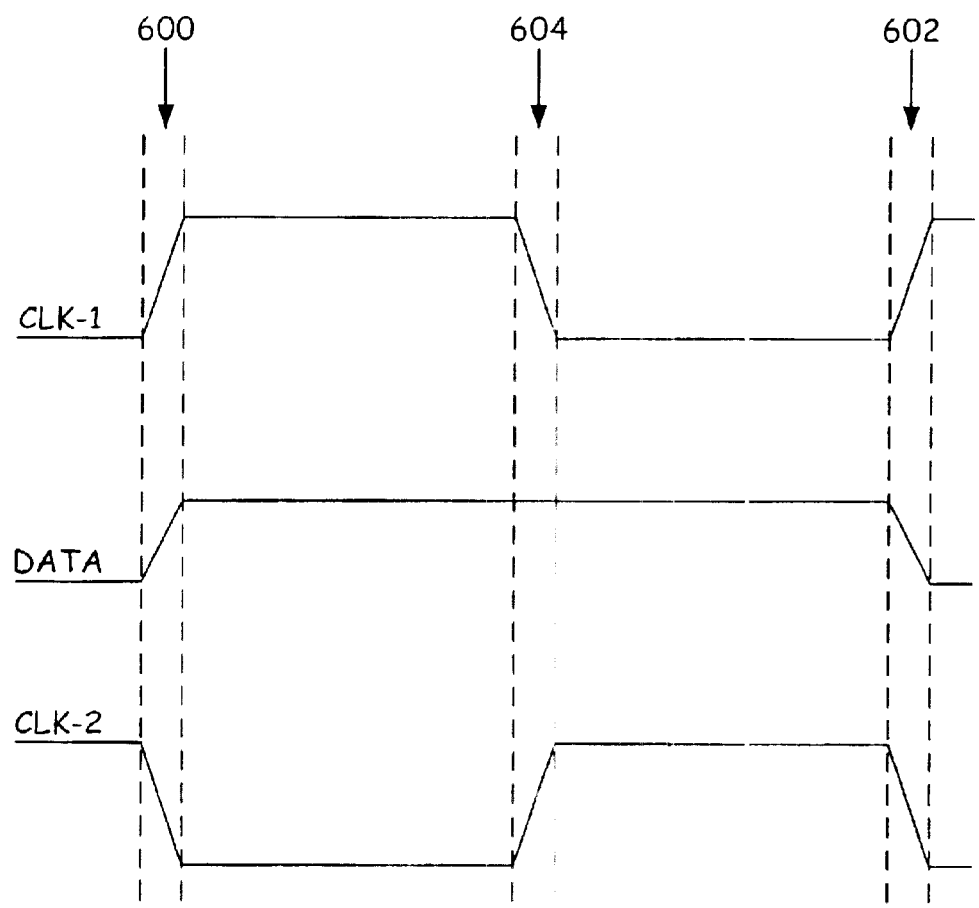
FIG. 3 illustrates edge-actuated data transitions over a cycle in an embodiment having best-case sampling synchronization.

FIG. 3 is a signal timing diagram illustrating an example of data being written onto and sampled from the data bus 210 of FIG. 2. The register 203 containing the data to be written onto the data bus 210 is actuated by clock signal CLK-1. In this example, the register 203 writes the data, the signal DATA, onto the bus 210 when the clock CLK-1 experiences a rising edge, e.g., during times 600 and 602. (Normally, when a change in clock signal is applied to a register, such as register 203, the change in output data is delayed. This is commonly referred to as "clock to data delay." For the purposes of this discussion, the clock to data delay of devices will be assumed to be zero without loss of generality.) Thus the value of the data line DATA generally experiences a transition caused by each rising edge of CLK-1. Of course, it is also possible to actuate the register 203 to write the data onto the data bus 210 on the falling edge of clock signal CLK-1, during time 604.

Register 205 reads, or samples, the data from the bus 210 and is actuated by clock signal CLK-2. The sampling process is actuated on a rising edge of clock signal CLK-2 during time 604. In this example, because the sampling occurs at 604, midway between the two data write times 600 and 602, there is little or no possibility for erroneous reading of the DATA signal by register 205. This is because the data signal has reached a stable value around time 604. This represents a best-case sampling.

Figure 4:
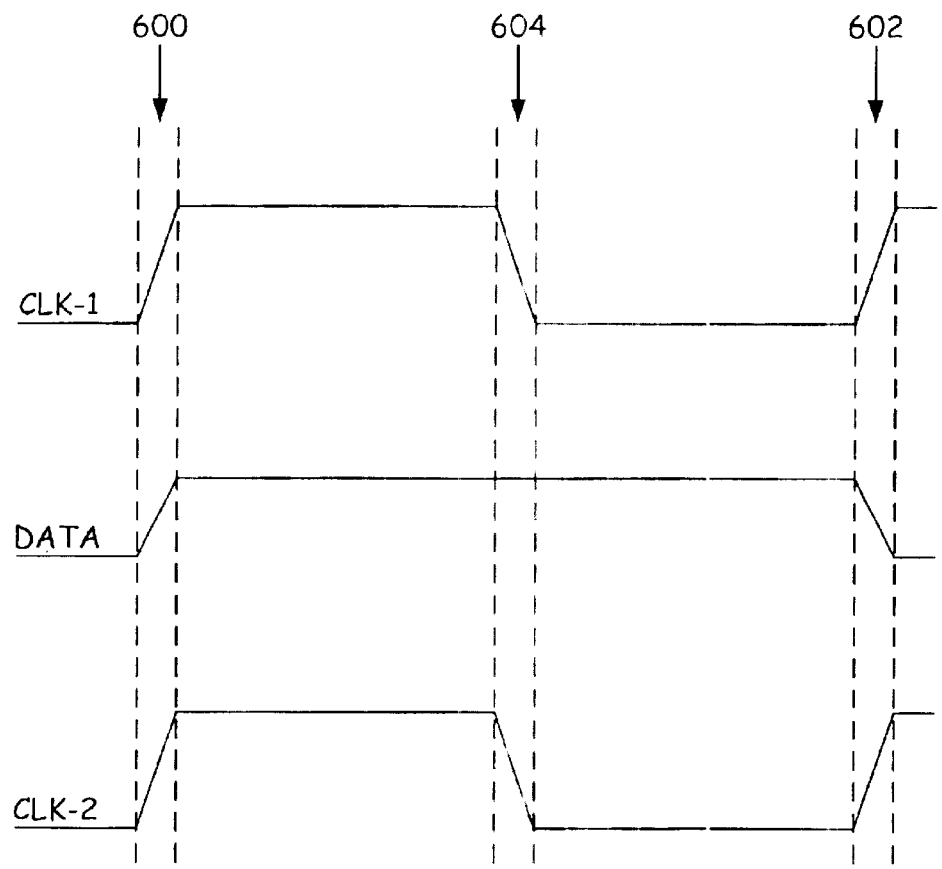
FIG. 4 illustrates edge-actuated data transitions over a cycle in an embodiment having worst-case sampling synchronization.

FIG. 4, on the other hand, illustrates a signal timing diagram with a worst-case sampling scenario for the circuit of FIG. 2. Register 203 writes DATA onto the bus 210 on the rising edges of clock signal CLK-1, during transition periods 600 and 602. Register 205 reads the data signal and is actuated by the rising edges of clock signal CLK-2, during times 600 and 602. This situation is undesirable because the register 205 reading the data does so during transitionary times 600 and 602, during which data signal DATA is not constant or stable. Thus, the probability of an erroneous reading of the value of the data signal is high.

Figure 5:
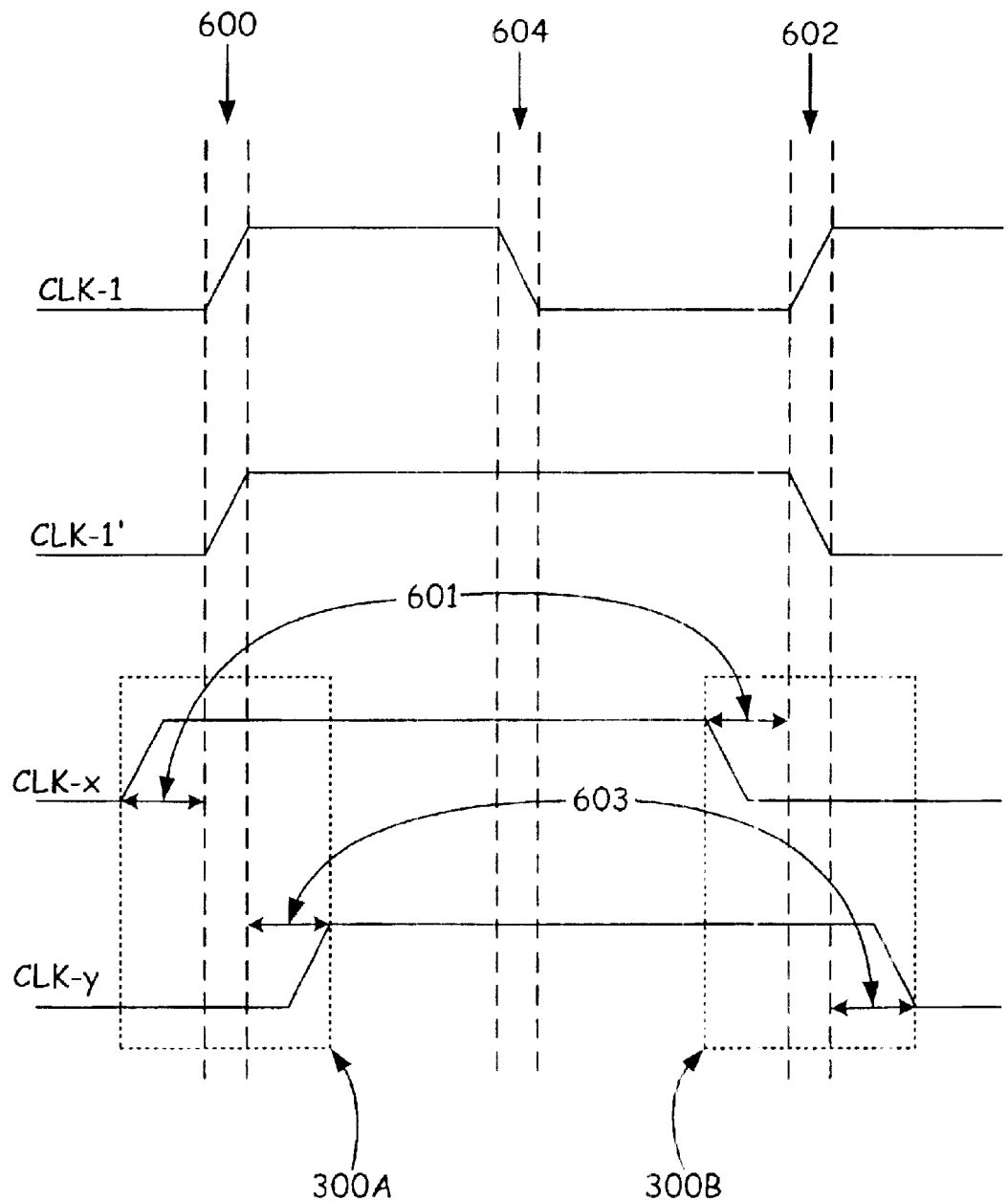
FIG. 5 illustrates an exemplary clock signal, pseudo-signal, and two time-shifted signals, as well as two error windows determined thereby.

FIG. 5 is a signal timing diagram that illustrates "error windows" 300A and 300B, during which it is undesirable to perform a data sampling operation in the circuit of FIG. 2. Register 203 writing the data signal DATA onto the data bus 210 is actuated on the rising edges of clock signal CLK-1. The rising edges occur during time periods 600 and 602. A second signal CLK-1' is generated based on clock signal CLK-1. CLK 1' is preferably generated by a circuit element similar to the one used in 203 in order to keep the clock to data delays the same. Signal CLK-1' is called a "pseudo-signal," and may be similar to CLK-1 except that it runs at an integer fraction of the frequency of CLK-1. In some embodiments, the integer fraction rate is unity (1/1) or less. In other embodiments, such as in FIG. 5, CLK-1' runs at one-half (½) the frequency of CLK-1, or at half the data rate. CLK-1' is then duplicated twice, generating signals CLK-x and CLK-y. CLK-x is advanced by some hold time 601, and signals CLK-y is delayed by some set-up time 603 with respect to CLK-1'. Advancing CLK-x may be accomplished by delaying all the other timing signals by a set amount. One embodiment of such a setup is discussed further in connection with and shown in FIG. 8. Generally, a controller controls the lengths of the set-up time 603 and the length of the hold time 601, as will be explained below. Usually the setup/hold time reflect the setup/hold times of the circuit elements used in 205. Note that the setup and hold times may be the same as or different from one another. Also note that both may be shifted in the same direction in time (e.g., delayed) but by different amounts. However, generally, the two time shifts are in opposite directions in time.

Signals CLK-x and CLK-y are sampled at a time related to clock 2 and with the same or similar circuit elements as those used in register 205. The sampled signals CLK-x and CLK-y may be compared. The comparison may be carried out by any suitable circuit or logic element or combination thereof that can serve as a comparator in a general sense. This includes any logic element or elements that can receive at least two input signals for comparing the two inputs and optionally yielding an output based on the comparison. An example of a logic block that would perform such a comparison of signals is an "exclusive-OR" (XOR) block or element, that produces an output or error signal corresponding to the results of an XOR operation on the two input signals (the sampled signals of CLK-x and CLK-y). An exemplary circuit is described below in reference to FIG. 8.

The results of a comparison of the sampled signals CLK-x and CLK-y may yield any of a variety of output signals. For example, a binary output signal can be produced that indicates whether the values of the sampled signals CLK-x and CLK-y are substantially equal or not. In one embodiment, if the two signals are substantially not equal at some instant in time, then this instant in time falls within an "error window" such as 300A and 300B. Determining such an error window or windows defined by CLK-x and CLK-y can be useful because it may be used to indicate that this is an undesirable time to perform a write and/or sample operation from the data bus 210 as the values of the data lines may be changing or unstable during the error windows 300A, 300B or may violate the setup and hold times of the circuit elements used in register 205. Note that there is a complimentary window of time, defined by the time lying outside the error windows 300A, 300B, as described above. In the instant application we use the term "error window" generally, and it can be either the window defined by the CLK-x XOR CLK-y=1 or the CLK-x XOR CLK-y=0 intervals, as it would be a simple matter to interchangeably use either window for the intended purpose, with any appropriate modifications.

It can be seen that the size of an error window 300A, 300B is limited by the cycle duration 112 itself (see FIG. 1), as some useful time should exist outside the error windows 300A, 300B, in order to allow for a stable write/read operation. That is, if the error windows 300A, 300B, were enlarged to a point where they overlapped, there would be no time outside the error windows 300A, 300B, during which it would be considered safe to write and/or sample data from the data bus 210.

In some aspects, it is useful to perform a sampling operation approximately or exactly midway between the data transition on bus 210. In FIGS. 3 and 4, the data transition times have been shown to correspond to the clock transition times because as discussed before, the clock to data delay of the registers has been assumed to be zero. Assuming the clock to data delay is zero, in FIG. 5, the approximate midway point would correspond to time period 604. One way to achieve this midpoint reading operation according to the present invention is to progressively enlarge the error windows 300A and 300B almost to the point of overlap, while simultaneously adjusting the samping time point to be outside the error window, thus moving the sampling time to approximately midway between 600 and 602. According to some embodiments, this can be done in an iterative fashion, as described below.

Figure 6:
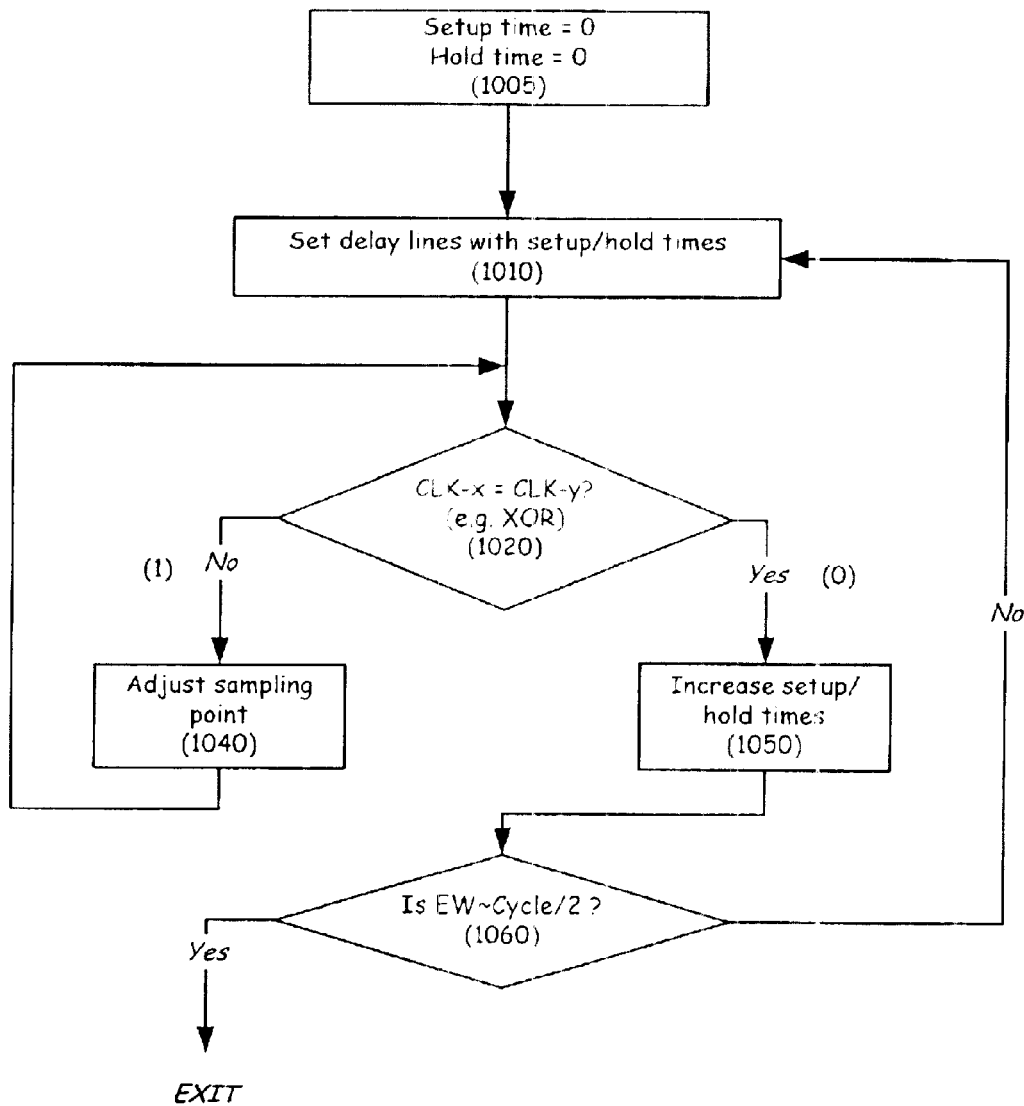
FIG. 6 illustrates an exemplary embodiment of a method for generating an error window and adjusting the error window to obtain sampling at a safe sample time.

FIG. 6 illustrates an exemplary flow diagram depicting acts to be performed to arrive at an acceptable error window size and position, according to one embodiment of the invention. Setup and hold times are initialized to zero. The set-up time 601 is applied to delay lines to yield the time-shifted (advanced) signal CLK-x in Act 1010. The hold time 603 is also applied to CLK-1' to yield the time-shifted (delayed) signal CLK-y in Act 1010. Pseudo-signal CLK-1' can be considered a reference signal, and the invention may utilize one reference signal shifted in opposite directions in time, or utilize two separate reference signals to result in the two time-shifted outputs CLK-x and CLK-y. Time-shifting of CLK-1' can be done using any circuit element or logic arrangement that functions as a time-shifter. One time-shifter or two separate time-shifters (e.g., delay lines) can be used to achieve the respective set-up and hold times, as would be known to those skilled in the art. The time-shifting of CLK-1' can be of any amount of time appropriate for a given implementation, and may depend on the cycle period of a circuit or a clock period or another practical or theoretical constraint.

Having obtained the advanced and delayed sampled version of signals CLK-x and CLK-y, the two signals are compared, such as by using an XOR operation, in Act 1020. The output of the XOR operation indicates whether signals CLK-x and CLK-y are the same. If the two signals are the same (CLK-x XOR CLK-y=0) then the setup and hold times are increased, which increases the size of error window 300A, 300B ("EW"). Otherwise, if signals CLK-x and CLK-y are not the same (CLK-x XOR CLK-y=1) then the point at which the data is sampled from the data bus is adjusted in Act 1040 until CLK-x XOR CLK-y=0. The direction of the shift is done to avoid the error window. Note that one or more steps may be taken in comparing CLK-x and CLK-y.

The size of the error window is compared to the size of the cycle (or one-half of the cycle time 112) in Act 1060. If the error window size is slightly less than one-half of the cycle size 112, then the read time has been constrained to a narrow time zone approximately midway between the transitionary periods 600 and 602, and the flow chart exits. However, if the error window size is not yet approximately one-half that of the cycle 112, then we return to Act 1010 and increase the set-up and hold times, 601 and 603, iterating the process until exiting the loop.

Figure 7:
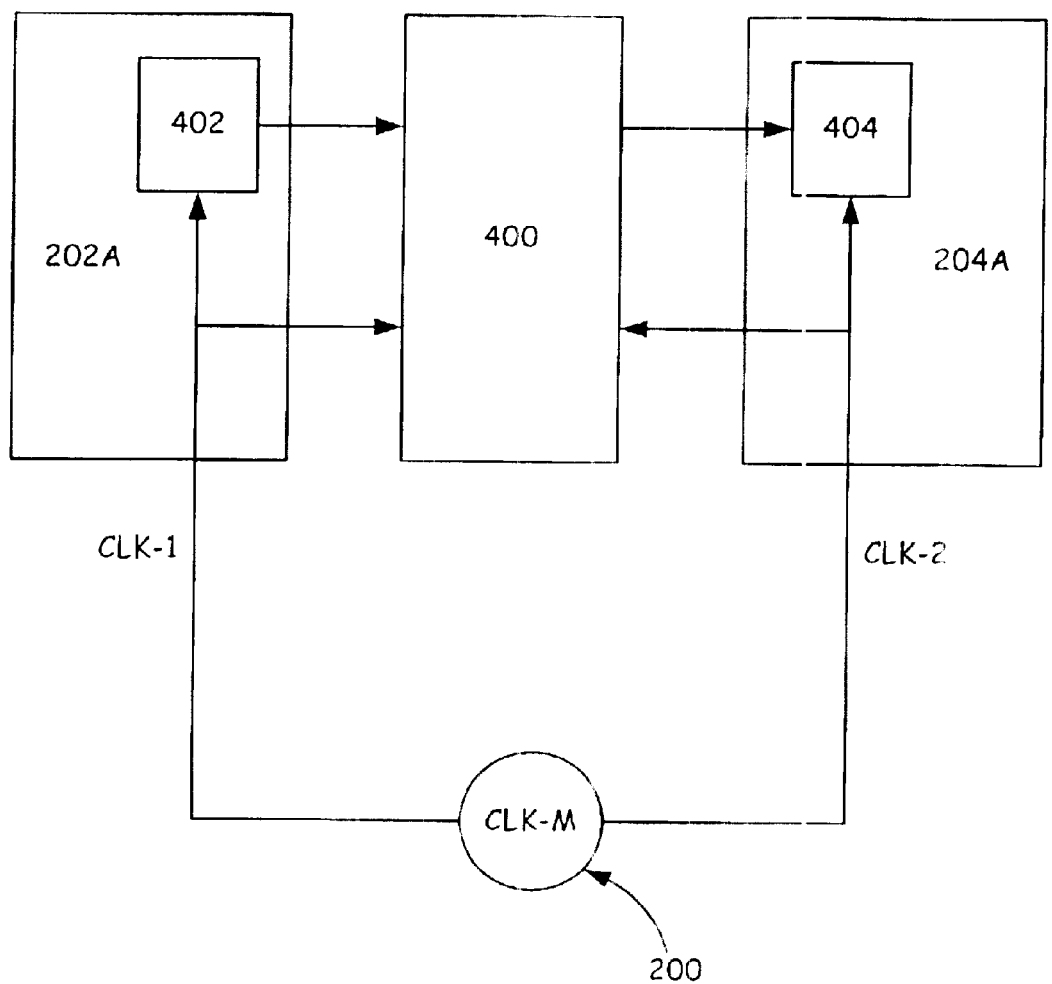
FIG. 7 illustrates an exemplary block diagram of a system having a synchronizing block between two circuits.

FIG. 7 illustrates a simplified schematic representation of a system for carrying out the aforementioned operations. A master clock 200 generating signal CLK-M, is used to provide clock signals CLK-1 and CLK-2 to two circuits, 202A and 204A. Clock signals CLK-1 and CLK-2 are used to sample and actuate registers 402 and 404. A "synchronizing block" 400 is used to perform functions allowing the two circuits 202A and 204A to communicate or exchange data without having timing problems related to separate clocking of write and sample operations, as described earlier. The synchronizing block 400 comprises retiming registers and a synchronization logic block, which is exemplified below. The specific logic used for registers 402 and 404 is known to those skilled in the art, and for example may be implemented using flip-flops.

Figure 8:
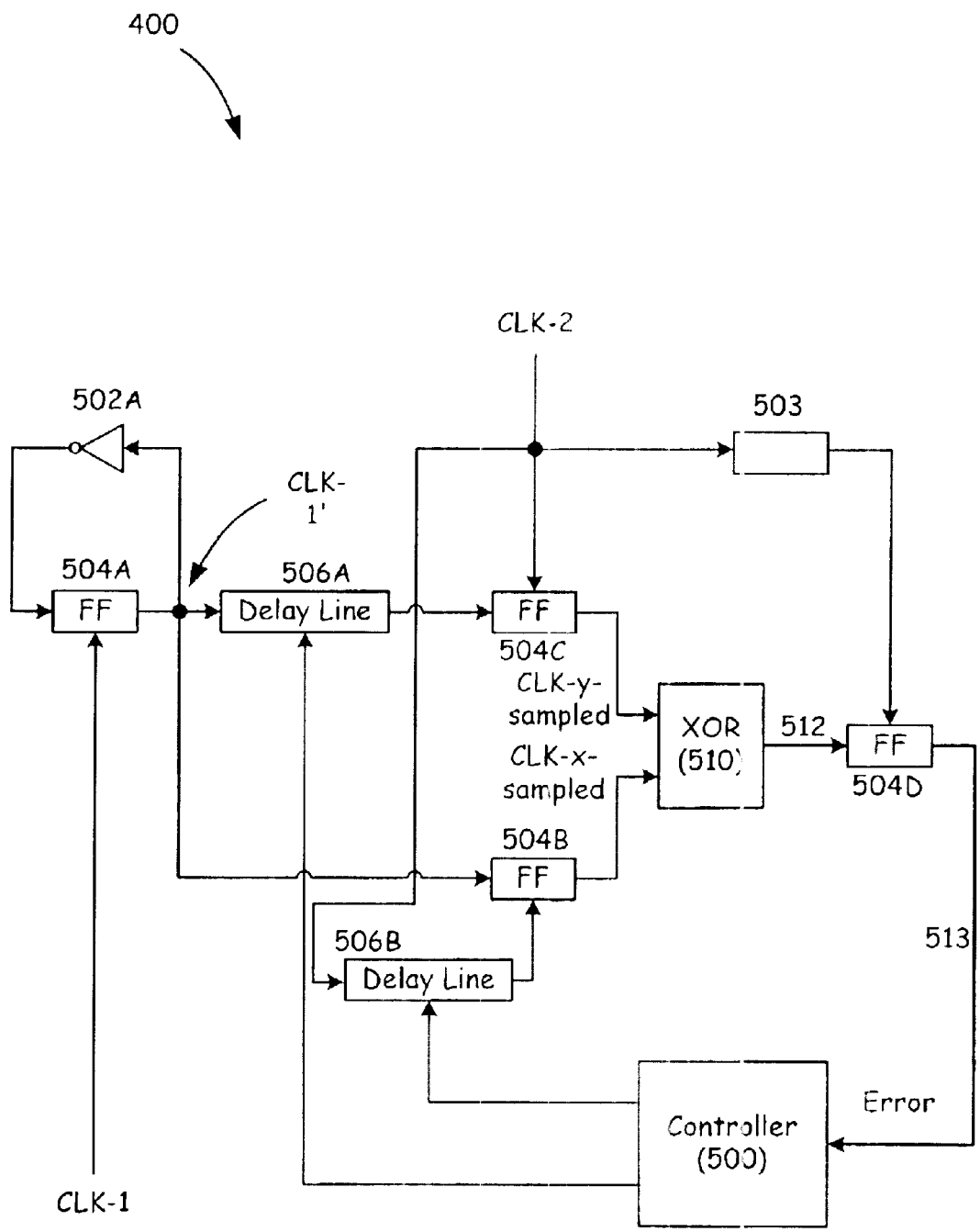
FIG. 8 illustrates an exemplary block diagram of a synchronizing block having a controller.

FIG. 8 illustrates an exemplary embodiment of some components of a synchronization block 400. The figure shows two clock signals, CLK-1 and CLK-2, belonging to two circuits or two parts of the same circuit as described earlier. The combination of flip-flop 504A and inverter 502A, connected in feedback with flip-flop 504A, acts as a signal generator that generates pseudo-signal CLK-1' from clock signal CLK-1. Controllable delay lines 506A and 506B are shown in FIG. 8 receiving their input signals from the left and their control signals from below, and having output signals to the right. Delay line 506A is connected to the output of flip-flop 504A to receive signal CLK-1' from flip-flop 504A and produces a delayed version of CLK-1', called CLK-y-sampled, as described earlier. In order to generate the CLK-x that is depicted in FIG. 5, which is shifted back in time, the clock input of the flip-flop which generates the sampled version of CLK-x, labeled CLK-x-sampled in FIG. 8, is delayed by delay line 506B.

As described previously, an exclusive OR 510 compares signals CLK-x-sampled and CLK-y-sampled and produces an error signal 512 which is provided to flip-flop 504D. Flip-flop 504D is clocked by a delayed version of CLK-2 that is provided by delay device 503. Flip-flop 504D stores the error signal 512 and writes it to a line 513 connecting flip-flop 504D to controller 500 or any other element that uses error signal 512.

Controller 500 adjusts the delays of delay lines 506A and 506B for the purpose of producing the set-up 601 and hold 603 times. This adjustment can be accomplished by any technique known to those skilled in the art, e.g., by causing a variation in a number of inverters within delay lines 506A and 506B, or by changing the time constant of an R-C circuit within delay lines 506A and 506B. Details for implementing various aspects of the invention are known to those skilled in the present art. For example, the delay lines, such as those shown in FIG. 8, may be implemented as a series of an appropriate number of inverters or other logic gates. Alternately, the delay lines may incorporate capacitor-resistance elements, forming an R-C delay element. Additionally, phase shifting may be implemented in some embodiments using a combination of flip-flops and multiplexers.

While the error windows 300A and 300B have been presented in an exemplary embodiment as being the time windows during which the offset signals CLK-x and CLK-y are different, this may be implemented in a number of ways. In addition to the implementation presented herein using the XOR logic, the error windows 300A and 300B may be defined generally as any function of these two signals. Thus, the error windows 300A and 300B may be a general function of an error signal 512 generated by CLK-x and CLK-y, or may be a function of the error signal 512 and yet another signal, depending on the specific application and requirement at hand.

The concepts presented herein may be extended to systems of greater than two circuits, or greater than two components of the same circuit. The details of implementation for multiple circuits or circuits with multiple clocks will become apparent to one skilled in the art and depend on the specific application at hand. However, according to one embodiment, generally, each two of the greater than two circuits may be treated in a fashion similar to that described herein.

One exemplary application of the present invention is in the interface of a digital-to-analog converter (DAC) with another circuit, such as a digital-domain circuit, implemented on the same chip and sharing a master clock with the DAC. Another exemplary application is in the interface of a DAC with a digital-domain circuit, wherein the DAC and the digital-domain circuit are driven by a master clock signal but are not implemented on the same chip.

While only certain preferred embodiments and features of the invention have been illustrated and described herein, many modifications and changes will occur to those skilled in the art. It is, therefore, to be understood that the appended claims are intended to cover all such modifications and changes as fall within the range of equivalents and understanding of the invention.

What is claimed is:

1. A method for transferring data between a first circuit, having a first clock signal, and a second circuit, having a second clock signal, comprising:

generating a first time-shifted signal corresponding to the first clock signal;

generating a second time-shifted signal corresponding to the first clock signal;

comparing the first and second time-shifted signals to yield an error signal; and sampling the data during a temporal window defined by the error signal.

2. The method of claim 1, wherein the first time-shifted signal and the second time-shifted signal are time shifted in opposite directions in time.

3. The method of claim 1, wherein the first time-shifted signal and the second time-shifted signal are time shifted in like directions in time, but by different amounts.

4. The method of claim 1, wherein the temporal window represents a time during which the first and second time-shifted signals have substantially equal values.

5. The method of claim 1, wherein the temporal window represents a time during which the first and second time-shifted signals have substantially unequal values.

6. The method of claim 1, further comprising generating a pseudo-signal from the first clock signal.

7. The method of claim 6, wherein generating the first and second time-shifted signals comprises generating the first and second time-shifted signals from the pseudo-signal.

8. The method of claim 6, wherein the pseudo-signal is generated by toggling between two values at an integer fraction of a data rate.

9. The method of claim 8, wherein the integer fraction is unity (1/1).

10. The method of claim 8, wherein the integer fraction is one-half (½).

11. The method of claim 8, wherein the integer fraction is less than one-half.

12. The method of claim 1, wherein comparing the first and second time-shifted signals comprises performing an exclusive-OR (XOR) logical operation with the first and second time-shifted signals as inputs.

13. The method of claim 1, wherein any of the first and second circuits is a digital-to-analog converter (DAC).

14. The method of claim 1, wherein any of the first and second circuits is a digital-domain circuit.

15. The method of claim 1, wherein generating the first time-shifted signal comprises generating a setup time by which the first time-shifted signal is shifted.

16. The method of claim 15, further comprising controlling the setup time using a controller.

17. The method of claim 1, wherein generating the second time-shifted signal comprises generating a hold time by which the second time-shifted signal is shifted.

18. The method of claim 17, further comprising controlling the hold time using a controller.

19. The method of claim 1, further comprising comparing a size of the temporal window with a cycle time of any of the first and second clock signals.

20. The method of claim 1, further comprising deriving the first and second clock signals from a master clock signal.

21. The method of claim 1, wherein the first and second circuits represent respective first and second components of a larger circuit comprising the first and second circuits.

22. A method for timing a circuit event, comprising acts of:
   A) time-shifting a first reference signal, by a setup time, to yield a first time-shifted signal;
   B) time-shifting any of the first reference signal or a second reference signal, by a hold time, to yield a second time-shifted signal;
   C) determining an error window, defined by a temporal offset between the first and the second time-shifted signals; and
   D) performing the circuit event at a time not falling within the error window.

23. The method of claim 22, wherein the act C) further comprises an act of:
   C1) determining the temporal offset by comparing the first and second time-shifted signals.

24. The method of claim 23, wherein the error window is determined by a window of time in which the first and second time-shifted signals are of substantially equal values.

25. The method of claim 23, wherein the error window is determined by a window of time in which the first and second time-shifted signals are of substantially unequal values.

26. The method of claim 23, wherein the circuit even comprises sampling data from a data line.

27. The method of claim 26, wherein the act D) further comprises:
   D1) adjusting the circuit event and performing acts C) and D) again for a first logical result of act C1); and
   D2) determining whether a size of the error window is approximately equal to an optimal size for a second logical result of act C1).

28. The method of claim 27, wherein the optimal size is one-half of a clock cycle of the first reference signal.

29. The method of claim 27, wherein the act D2) further comprises acts of:
   D3) performing the circuit event if the size of the error window is determined to be approximately equal to the optimal size; and
   D4) increasing the setup time and the hold time and performing acts A), B), C), and D) again if the size of the error window is determined not to be approximately equal to the optimal value.

30. The method of claim 22, wherein the circuit event comprises sampling data from a data line.

31. The method of claim 22, wherein any of the first and second reference signals corresponds to a clock signal.

32. The method of claim 22, wherein the setup time and the hold time are substantially equal.

33. The method of claim 22, wherein the setup time and the hold time are substantially not equal.

34. The method of claim 22, wherein the setup time and the hold time are controllable by a controller.

35. A system for transferring data, comprising:
   a data line, receiving data from a first circuit, said first circuit having a first clock signal;
   a signal generator receiving the first clock signal and producing a pseudo-signal;
   a first time shifter receiving the pseudo-signal and generating a first time-shifted signal;
   a second time shifter receiving the pseudo-signal and generating a second time-shifted signal; and
   a comparator, for comparing the first and second time-shifted signals, receiving the first and second time-shifted signals and producing an error signal for synchronizing data sampling from the data line during a temporal window defined by the error signal.

36. The system of claim 35, wherein the first and second time-shifters and the comparator are disposed in a synchronizing block.

37. The system of claim 35, further comprising a controller for controlling the time shifters.

38. The system of claim 37, wherein the first time-shifter and the second time-shifter are each clocked by a second clock signal.

39. The system of claim 38, wherein the first time-shifter comprises a flip-flop arranged to receive a delayed version of the pseudo-signal.

40. The system of claim 39, wherein the second time-shifter comprises a flip-flop and is clocked by a delayed version of the second clock signal.

41. The system of claim 35, wherein the time shifters are distinct from one another.

42. The system of claim 35, wherein the time shifters are one and the same time shifter, being alternately used for generating the first and second time-shifted signals.

* * * * *